(12) United States Patent
Chigullapalli et al.

(10) Patent No.: US 12,007,305 B2
(45) Date of Patent: Jun. 11, 2024

(54) LIQUID COLLECTION, DETECTION AND CONTAINMENT SYSTEM FOR LIQUID COOLED SERVERS

(71) Applicant: ZT Group Int'l, Inc., Secaucus, NJ (US)

(72) Inventors: Sruti Chigullapalli, Seattle, WA (US); Lauren Ficek, Lyndhurst, NJ (US); Karan Mehta, Garfield, NJ (US)

(73) Assignee: ZT GROUP INT'L, INC., Secaucus, NJ (US)

( * ) Notice: Subject to any disclaimer, the term of this patent is extended or adjusted under 35 U.S.C. 154(b) by 413 days.

(21) Appl. No.: 17/400,769

(22) Filed: Aug. 12, 2021

(65) Prior Publication Data

US 2023/0052992 A1 Feb. 16, 2023

(51) Int. Cl.
G01M 3/04 (2006.01)
G01M 3/18 (2006.01)
H05K 7/20 (2006.01)

(52) U.S. Cl.
CPC .......... *G01M 3/045* (2013.01); *G01M 3/186* (2013.01); *H05K 7/20272* (2013.01); *H05K 7/20763* (2013.01)

(58) Field of Classification Search
CPC .......... H05K 7/20272; H05K 7/20763; G01M 3/186; G01M 3/045
USPC .......................................................... 73/49.2
See application file for complete search history.

(56) References Cited

U.S. PATENT DOCUMENTS

| | | | |
|---|---|---|---|
| 10,512,195 B2* | 12/2019 | Franz | H05K 7/20781 |
| 2014/0251583 A1* | 9/2014 | Eriksen | H05K 7/20772 |
| | | | 165/104.33 |
| 2019/0044372 A1* | 2/2019 | Cochran | H02J 9/061 |
| 2019/0223324 A1* | 7/2019 | Le | H05K 7/20263 |
| 2019/0373776 A1* | 12/2019 | Gao | H05K 7/20772 |
| 2022/0196507 A1* | 6/2022 | Subrahmanyam | G01M 3/20 |
| 2023/0063710 A1* | 3/2023 | Gao | H05K 7/20509 |

* cited by examiner

*Primary Examiner* — Nathaniel T Woodward
(74) *Attorney, Agent, or Firm* — POLSINELLI PC

(57) ABSTRACT

A system is provided for collection, detection and containment of leaked liquid. The system may include a spout connected to a liquid cooling manifold for channeling liquid. The system may also include a collection tray positioned under the spout and configured to contain the liquid from the spout. The system may further include a leak detection rope having a first end coupled to the liquid cooling manifold, a middle portion extending along the spout, and a second end placed inside the collection tray for detection of liquid.

20 Claims, 7 Drawing Sheets

LIQUID COLLECTION, DETECTION AND CONTAINMENT SYSTEM FOR LIQUID COOLED SERVERS

FIELD

The disclosure is directed to a system for leak liquid collection, detection and containment used in racks that hold liquid cooled servers.

BACKGROUND

High performance computing servers are energy intensive and densely configured, which produces more heat in smaller spaces in a data center. As the rack density for servers increases, the data center may have a need for more efficient and effective cooling technologies. A traditional air cooling is not a sustainable solution in these settings. Liquid cooling to the servers in the data center helps more efficient heat removal than the traditional air cooling. The liquid cooling is to cool computer components (or full servers) using a glycol based thermally conductive liquid (e.g. Propylene Glycol 25%+DI water 75%) allowing higher heat transfer performance than air and many other benefits. For example, a rack-level liquid cooling can achieve much higher efficiencies than the traditional air cooling.

There still remains a need for a system to manage leak detection and liquid collection for liquid cooled servers in data centers.

BRIEF SUMMARY

In one aspect, a system is provided for collection, detection and containment of leaked liquid. The system may include a spout connected to a liquid cooling manifold for channeling liquid. The system may also include a collection tray positioned under the spout and configured to contain the liquid from the spout. The system may further include a leak detection rope having a first end coupled to the liquid cooling manifold, a middle portion extending along the spout, and a second end placed inside the collection tray for detection of liquid.

In another aspect, a collection tray is provided for collecting liquid. The tray may include a bottom with a surrounding edge. The tray may also include four side walls extending upward from the surrounding edge of the bottom and surrounding an open top. The tray may further include a front end with a bottom attachment configured to attach to a rack and a back end configured to be supported by a racket that is attached to the rack.

Additional embodiments and features are set forth in part in the description that follows, and will become apparent to those skilled in the art upon examination of the specification or may be learned by the practice of the disclosed subject matter. A further understanding of the nature and advantages of the disclosure may be realized by reference to the remaining portions of the specification and the drawings, which forms a part of this disclosure.

BRIEF DESCRIPTION OF THE DRAWINGS

The description will be more fully understood with reference to the following figures and data graphs, which are presented as various embodiments of the disclosure and should not be construed as a complete recitation of the scope of the disclosure, wherein.

DETAILED DESCRIPTION

The disclosure may be understood by reference to the following detailed description, taken in conjunction with the drawings as described below. It is noted that, for purposes of illustrative clarity, certain elements in various drawings may not be drawn to scale.

When leaks occur within a server system using liquid cooling, the liquid may cause a few issues if the liquid is not properly collected. First, leaked liquid that is not channeled into a collection mechanism may cause damage to components in the servers. Second, there may be a liquid detection malfunction. The liquid may not drip where it can be detected or a detection mechanism may not be present in a location where the unchanneled liquid puddles up. Third, there is a safety concern. The leaked liquid may cause a mess surrounding the rack for holding servers, and may cause safety hazards.

The disclosure provides a liquid collection and detection system that solves the above problems by channeling leaked liquid towards a reservoir, using a liquid detection system, and providing a collection tray to contain the liquid until a rack for holding the server system can be serviced.

The liquid collection and detection system may include a manifold spout for channeling liquid leak. The liquid collection and detection system may also include a leak detection rope for service alert. The liquid collection and detection system may also include a collection tray for liquid collection and containment. The liquid collection and detection system including a combination of the manifold spout and the collection tray may collect leaked liquid flowing the liquid cooling manifold and retain the liquid in the collection tray.

Figure 1:
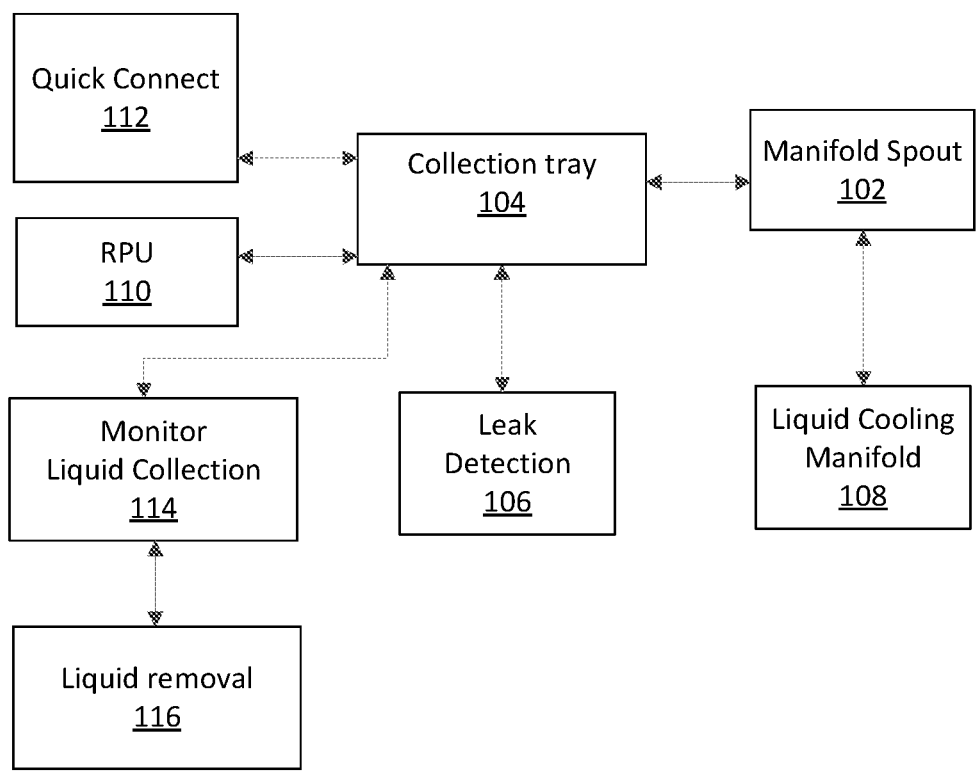
FIG. 1 illustrates a liquid collection system diagram in accordance with an embodiment of the disclosure.

FIG. 1 illustrates a liquid collection system and operation diagram in accordance with an embodiment of the disclosure. As shown, a spout 102 is coupled to a liquid cooling manifold 108 to channel the liquid from the liquid cooling manifold 108. A liquid collection tray 104 coupled to the spout 102 to collect the liquid. A leak detection rope 106 is coupled to the liquid collection tray 104 for detecting liquid in the liquid collection tray 104. The liquid collection tray 104 is also coupled to an RPU 110 and quick connects 112 for collecting liquids from the RPU 110 and quick connects 112.

The liquid collection tray 104 may also be coupled to a liquid monitoring device 114 for visually monitoring the liquid level in the collection tray 104. When the liquid collection tray 104 has the liquid level high enough, the liquid in the liquid collection tray 104 can be removed at block 116.

Figure 2:
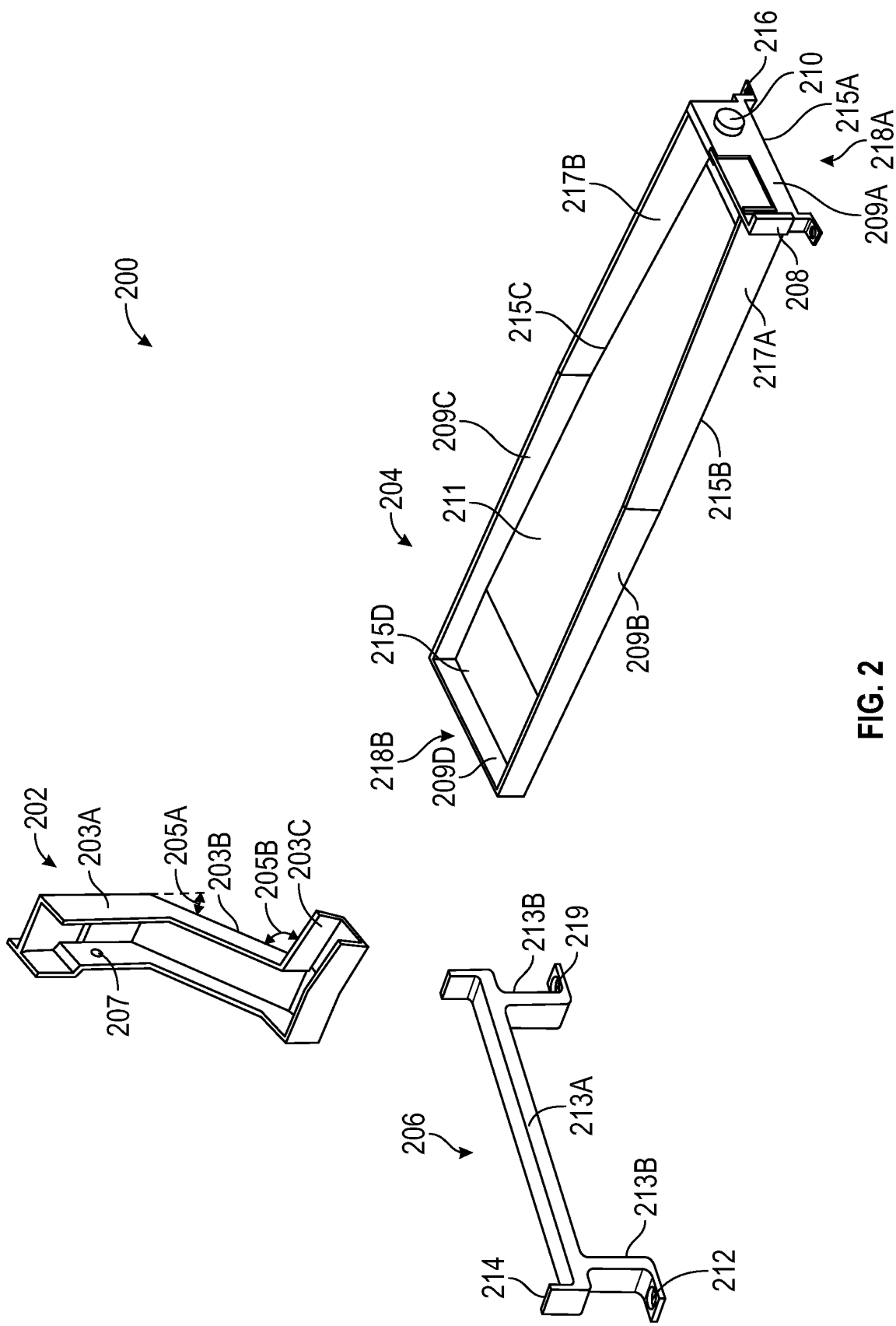
FIG. 2 illustrates a perspective view of a liquid collection system including manifold sprout, collection tray, and rear support bracket in accordance with an embodiment of the disclosure.

FIG. 2 illustrates a perspective view of a liquid collection system including manifold sprout, collection tray, and rear support bracket in accordance with an embodiment of the disclosure. A liquid collection system 200 includes a spout 202 configured to connect to a liquid cooling manifold for channeling the liquid. The spout 202 may include a first section 203A extending vertically, the first section 203A being fluidly coupled to a second section 203B extending from the first section 203A at a first angle 205A. The spout 202 may further include a third section 203C coupled to the second section 203B of the spout at a second angle 205B. The first section 203A is configured to channel the liquid from the liquid cooling manifold to flow down vertically, and the second section 203B and the third section 203C are configured to allow the liquid to flow into a collection tray 204.

The liquid collection system 200 includes the collection tray 204 serving as a reservoir for collecting and containing all leak liquids. The collection tray 204 includes a front end 218A and a back end 218B supported by a bracket 206. The front end 218A is configured to attach to a rack that holds servers.

The collection tray 204 includes a bottom 211 having four surrounding edges 215A-D. The surrounding edge 215A is near the front end 218A, while the surrounding edge 215D is near the back end 218B. The surrounding edges 215B and 215C are between the front end 218A and the back end 218B and opposite to each other. The collection tray 204 includes four side walls 209A-D extending upward from respective four surrounding edges 215A-D and an open top within the four side walls. The four side walls include a front side wall 209A near the front end 218A, a back side wall 209D near the back end 218B, and two connection side walls 209B and 209C between the front side wall 209A and the back side wall 209D.

The front side wall 209A near the front end 218A has a smaller width and a larger depth than the back side wall 209D near the back end 218B. The two connection side walls 209B and 209C between the front end and back end side walls may include respective portions 217A and 217B that have the depth continuously increasing, such that the depth of the front side wall 209A neat the front end is larger than the back side wall 209D near the back end 218B. The portions 217A and 217B of the respective side walls 209A and 209B between the front end 218A and back end 218B have the widths continuously decreasing, such that the width of the front side wall 209A neat the front end is smaller than the back side wall 209D near the back end 218B. The bottom 211 of the collection tray may be in a near-rectangular shape.

Near the front end 218A, the collection tray 204 may also include two bottom attachments 216 extending downward from the bottom 211 and then extending sideway. The attachments 216 are configured to attach to the rack, for example, with holes configured for fastener to pass through.

The tray may collect liquids from other components. For instance, the liquid may be leaked from Reservoir Pump Unit (RPU). The liquid may also be leaked from Quick Disconnects (QDs) may drip downward and can be collected in the same reservoir. It will be appreciated by those skilled in the art that the liquid from various components of the servers or associated systems may all be collected in the tray or reservoir.

The collection tray 204 can provide a front-side service. While the collection tray 204 does not need to be removed to be serviced, the front-side attachment 216 allow the collection tray 204 to be removed without access to the back of the rack for holding servers.

The system 200 may also include a backet 206 including a horizontal beam portion 213A and two vertical portions 213B spaced apart and connected to the horizontal beam portion 213A. The horizontal beam portion 213A of the backet 206 is configured to support the back end 218B of the collection tray 204. The horizontal beam portion 213A has two opposite ends connected to two side portions 214 extending upward from the horizontal beam portion 213A. The two side portions 214 are spaced apart by the horizontal beam portion 213A. Each of the two vertical portions 213B of the bracket 206 includes a bottom portion 212 extending outwardly, the bottom portion 212 being substantially perpendicular to the side portion 213B. Each bottom portion 212 is configured to attach to the rack through an attachment hole 219. The back end 218B of the collection tray 204 is configured to be supported by the horizontal beam portion 213A of the bracket 206.

The collection tray 204 provides visual liquid level indication by using an optically transparent or semi-transparent cap 210 or an optically transparent or semi-transparent door 218 on the front of the reservoir which is a liquid container. The optically transparent or semi-transparent cap or optically transparent or semi-transparent door allows the level of liquid to be monitored.

The system 200 may include a leak detection rope, which can be placed inside the reservoir to detect when the liquid is present. The leak detection system includes sensors (e.g. flat probe, and/or rope sensor) and can detect the liquid leak and provides a service alert. For example, the leak detection system may make noises to alert a service. The leak detection rope may also send a signal to a controller, which may suggest that the server system may be serviced.

Figure 3:
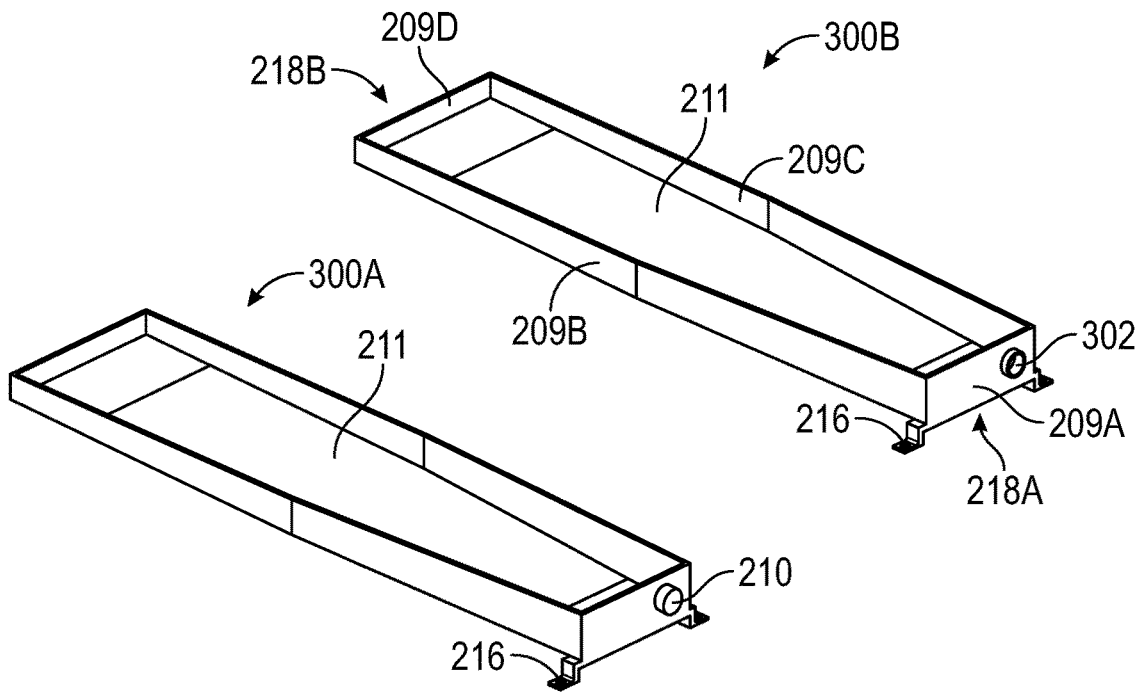
FIG. 3 illustrates a perspective view of a collection tray with a drain sprout open and closed with an optically transparent or semi-transparent cap covering the drain sprout in accordance with an embodiment of the disclosure.

FIG. 3 illustrates a perspective view of a collection tray with a drain sprout open and closed with an optically transparent or semi-transparent cap covering the drain sprout in accordance with an embodiment of the disclosure. As shown in FIG. 3, the liquid can be collected with the cap 210 as in a collection tray configuration 300A, and the liquid can be removed through a drain spout 302 with the cap 210 removed as shown in a collection tray configuration 300B.

The collection tray as shown in configuration 300B may include the drain spout 302 on a side wall 304A near the front end 218A for fluid suction. The drain spout 302 allows the collection tray to be emptied without being removed from the rack.

The drain spout 302 on the tray 204 may be oriented towards the front of the rack. In some variations, the drain sprout 302 may be covered with an optically transparent or semi-transparent cap 210, so that the liquid level can be determined visually without removing the tray. When the liquid has been collected in the tray, the cap 210 can be removed, and the liquid can be suctioned out.

In some variations, an optically transparent or semi-transparent door can be used instead of the optically transparent or semi-transparent cap for the same purpose as the optically transparent or semi-transparent cap.

Figure 4:
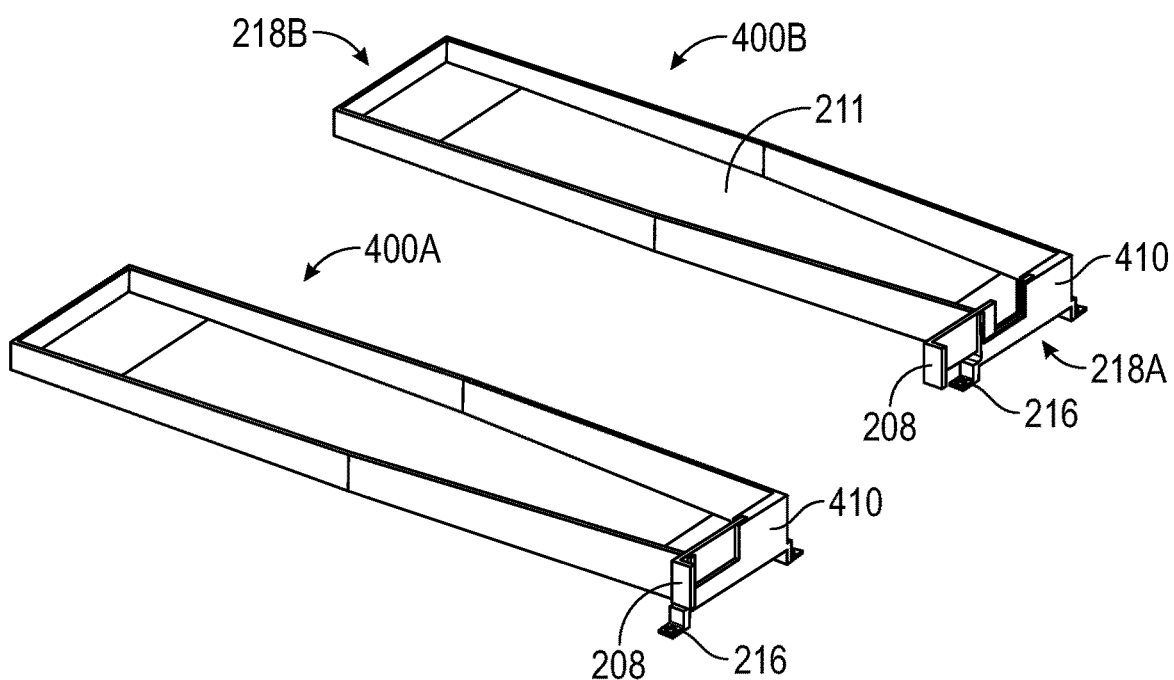
FIG. 4 illustrates a perspective view of a collection tray with an optically transparent or semi-transparent sliding door closed and open in accordance with another embodiment of the disclosure.

FIG. 4 illustrates a perspective view of a collection tray with an optically transparent or semi-transparent sliding door closed and open in accordance with another embodiment of the disclosure. As shown in FIG. 4, the liquid has been collected with the door 208 closed in configuration 400A. The side wall 404A includes a standing portion 410 and a moving portion or the sliding door 208. The standing portion 410 is configured to match to the sliding door. The optically transparent or semi-transparent door 208 can be opened in configuration 400B, and the liquid can be suctioned out.

Figure 5:
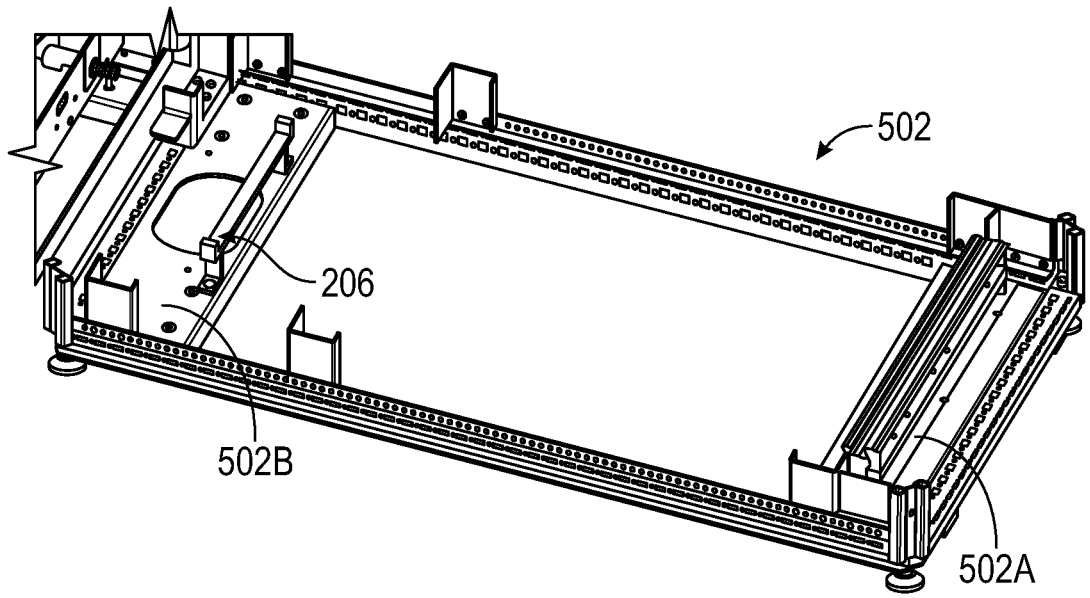
FIG. 5 illustrates a perspective view of a rack with the bracket of FIG. 2 installed in accordance with an embodiment of the disclosure.

FIG. 5 illustrates a perspective view of a rack with the bracket of FIG. 2 installed in accordance with an embodiment of the disclosure. As shown, a rack 502 has a front side 502A and a rear side 502B. The rear support bracket 206 is mounted on the rack 502 near the rear side 502B.

Figure 6:
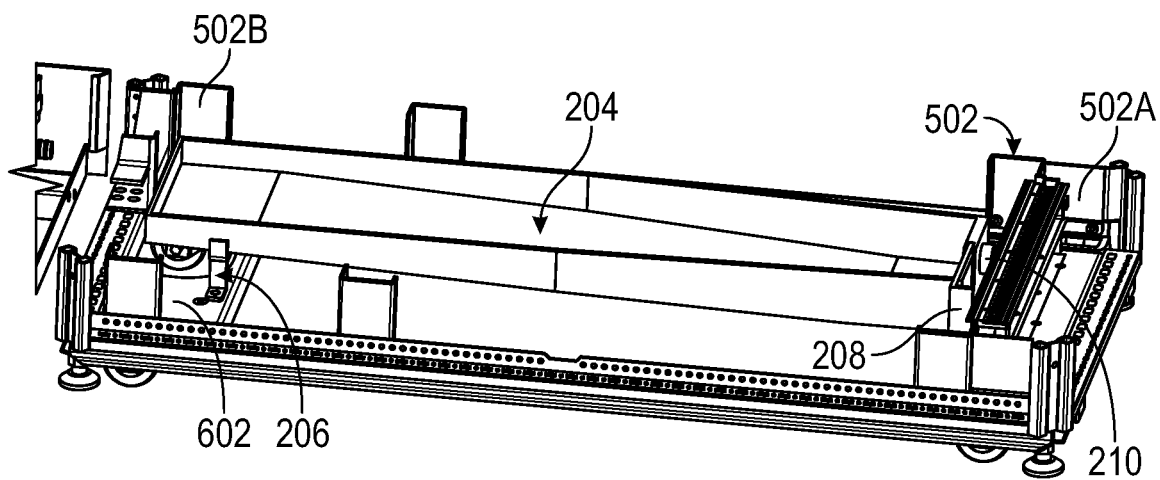
FIG. 6 illustrates a perspective view of the collection tray of FIG. 3 installed in the rack of FIG. 5 in accordance with an embodiment of the disclosure.

FIG. 6 illustrates a perspective view of the collection tray of FIG. 3 installed in the rack of FIG. 5 in accordance with an embodiment of the disclosure. The tray 204 may have one end supported by the rear support bracket, which is attached to a bottom 602 of the rack 502. The tray 204 has another end attached to the bottom 602 of the rack 502 with screws through the holes 216. The tray 204 can collect leaked liquids. As an example, the tray 204 may collect up to 11.4 liters. It will be appreciated that the volume of the tray may vary.

Figure 7:
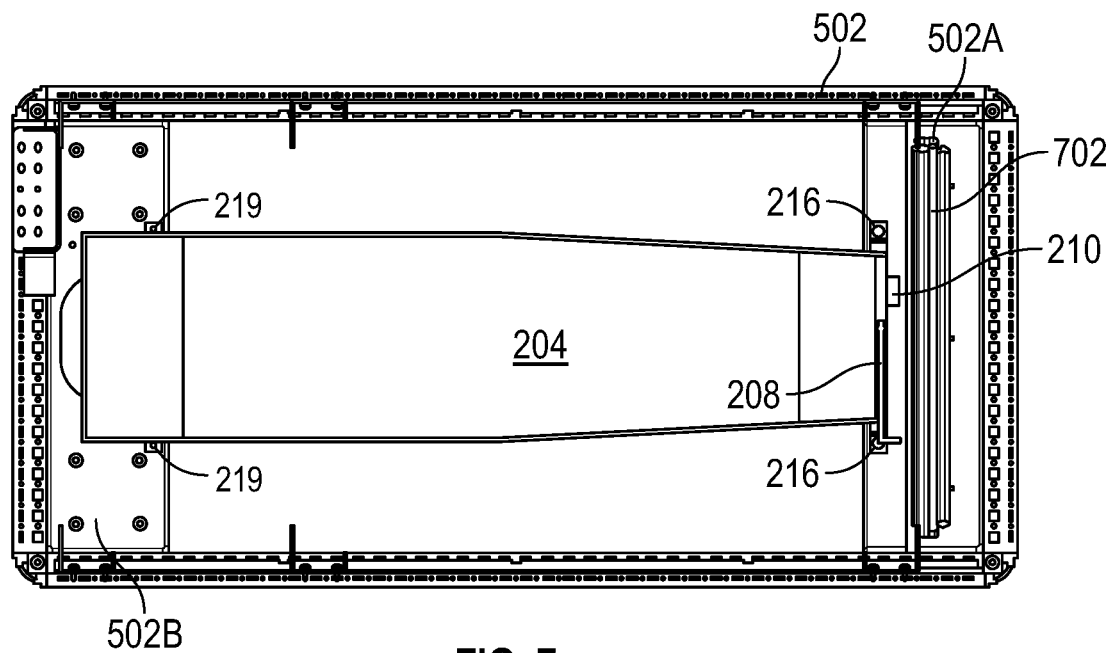
FIG. 7 illustrates a top view of the collection tray of FIG. 3 installed in the rack of FIG. 5 in accordance with an embodiment of the disclosure.

FIG. 7 illustrates a top view of the collection tray of FIG. 3 installed in the rack of FIG. 5 in accordance with an embodiment of the disclosure. As shown, air baffles 702 may in installed on the right side of the rack 502. The air baffles 702 may change airflow or re-directs airflow. The air baffles 702 may also send cooled air to airflow panels in a cold aisle, Also, near the front side 502A, the tray 204 is mounted to the bottom 602 of the rack 502 through attachment 216 of the collection tray. Near the back end 502B, the racket 206 is mounted on the bottom 602 of the rack 502 through attachment hole 219.

Figure 8:
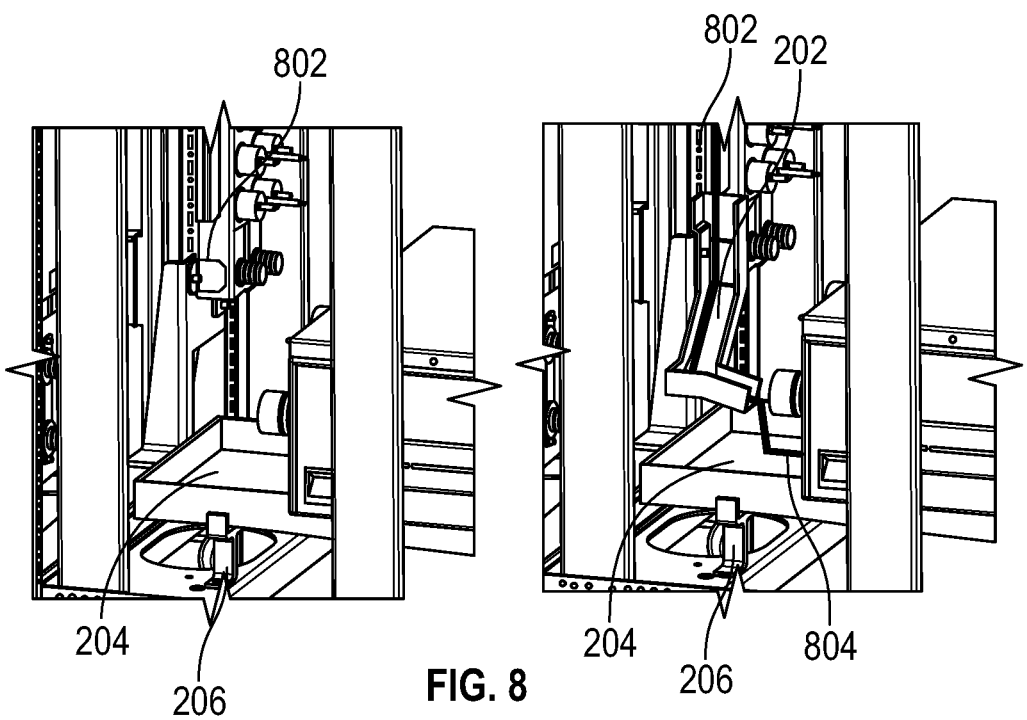
FIG. 8 illustrates a perspective view of a rack including manifold without manifold spout (left) and with spout (right) in accordance with an embodiment of the disclosure.

FIG. 8 illustrates a perspective view of a rack including manifold without manifold spout (left) and with spout (right) in accordance with an embodiment of the disclosure. As shown, manifold spout 202 is connected to a bottom end of a liquid cooling manifold 802, which provides liquid supply and liquid return for a number of servers that are mounted on the rack 502. The liquid may be water among others. The manifold spout 202 may attach directly to the liquid cooling manifold 802 to ensure any liquid flowing from the liquid cooling manifold 802 to be collected. The manifold spout 202 is a channel having a section projecting toward the tray which is a container, or reservoir for containing the liquid, through which the liquid can be poured.

The liquid cooling manifold 802 may be mounted on the rear side 502B of the rack 502. The liquid cooling manifold 802 does not interfere with the placement of servers or other I/O drawers. Quick connect fittings may be located on the manifold 802 for liquid supply and return.

The servers may be connected to the liquid cooling manifold 802 through quick connects or quick connect fittings. The manifold 802 has one cold liquid (e.g. water) inlet that leads to the rack 502 and one warm liquid (e.g. water) outlet.

As shown in FIG. 8, a leak detection rope 804 is coupled to the liquid cooling manifold 802 and the manifold spout and extend into the tray 204. The leak detection rope 804 is the extension of the same rope used on the liquid cooling manifold 802. The leak detection rope 802 may include sensors along the rope. The leak detection rope 802 can detect the presence of liquid, such as water. The leak detection rope 802 is also referred to as a sensor rope or a leak detection cable. The leak detection rope 802 may be formed of a strong, durable, non-conductive polymer to reduce false alarms, while remaining highly flexible for easy placement around equipment. The leak detection rope 802 may vary in lengths.

Figure 9:
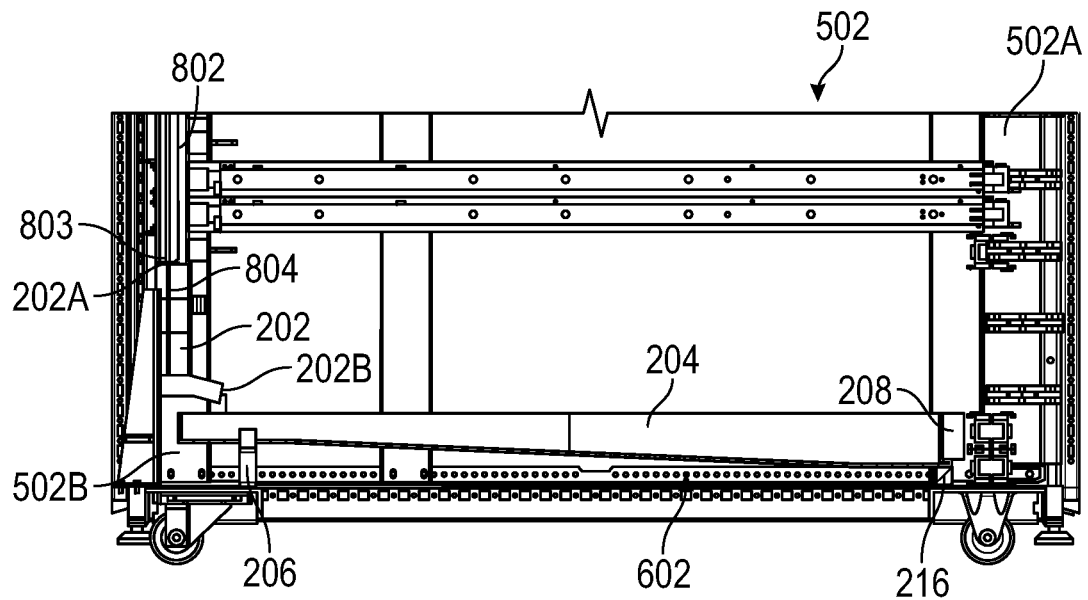
FIG. 9 illustrates a side view of the liquid collection system installed in a rack in accordance with an embodiment of the disclosure.

FIG. 9 illustrates a side view of the liquid collection system installed in a rack in accordance with an embodiment of the disclosure. As shown in FIG. 9, on the rear side 502B of the rack 502, an upper end 202A of the manifold spout 202 is coupled to a bottom end 803 of the liquid cooling manifold 802. A lower end 202B of the manifold spout 202 extends toward the collection tray 204 and overlaps a portion with the collection tray 204, so that the liquid from the manifold spout 202 would flow into the collection tray 204.

As shown in FIG. 9, the collect tray 204 extends to cross the rack 502 from the rear side 502B to the front side 502A. The collection tray 202 has the sliding door 208 near its front end 218A, which is located near the front side 502A of the rack 502. Also, as shown, the back end 218B of the collection tray 204 is supported by the rear support rack 206. The back end 218B of the collection tray 204 is near the manifold spout 202. The rear support rack 206 is mounted on a bottom 602. Also, a depth of the collection tray 204 becomes deeper toward the sliding door 208. The collection tray 204 is mounted on the bottom 602 of the rack 502 through the attachment 216 near the front side 502A of the rack 502.

Figure 10:
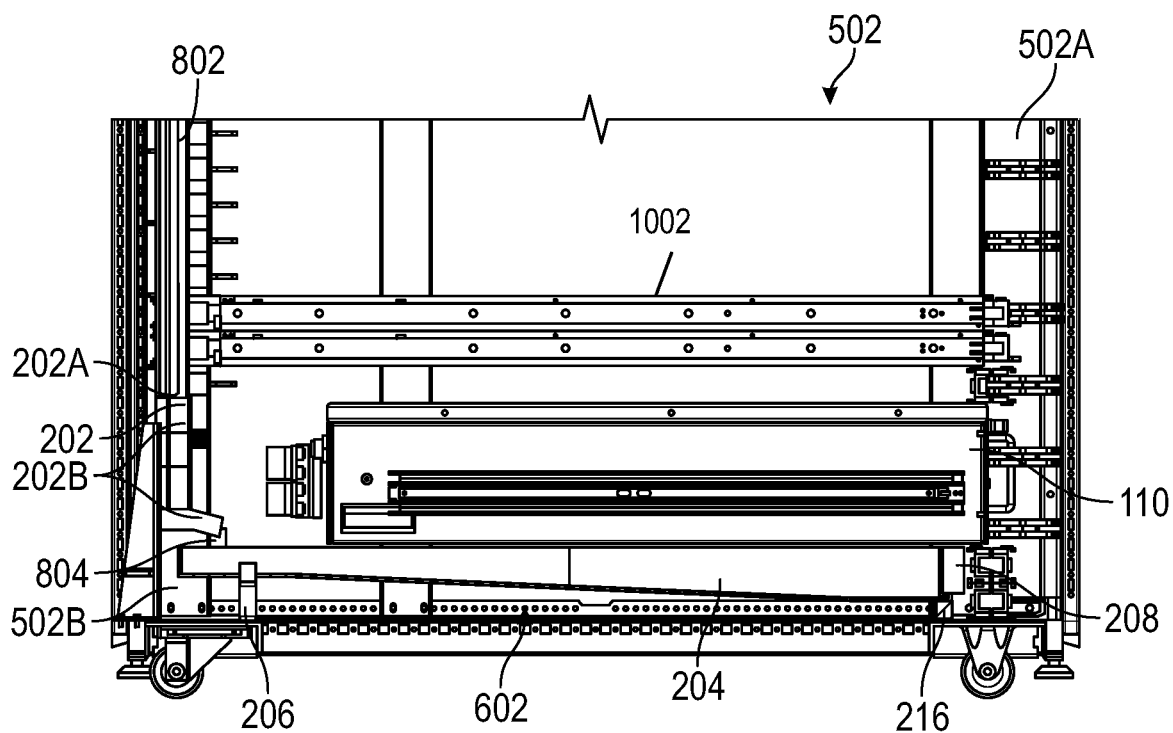
FIG. 10 illustrates a side view of an Reservoir Pump Unit (RPU) installed in the rack of FIG. 9 in accordance with an embodiment of the disclosure.

FIG. 10 illustrates a side view of an Reservoir Pump Unit (RPU) installed in the rack of FIG. 9 in accordance with an embodiment of the disclosure. As shown, the RPU 110 is installed on the rack 502 above the collection tray 204. Two servers 1002 are installed above the RPU 110.

Figure 11:
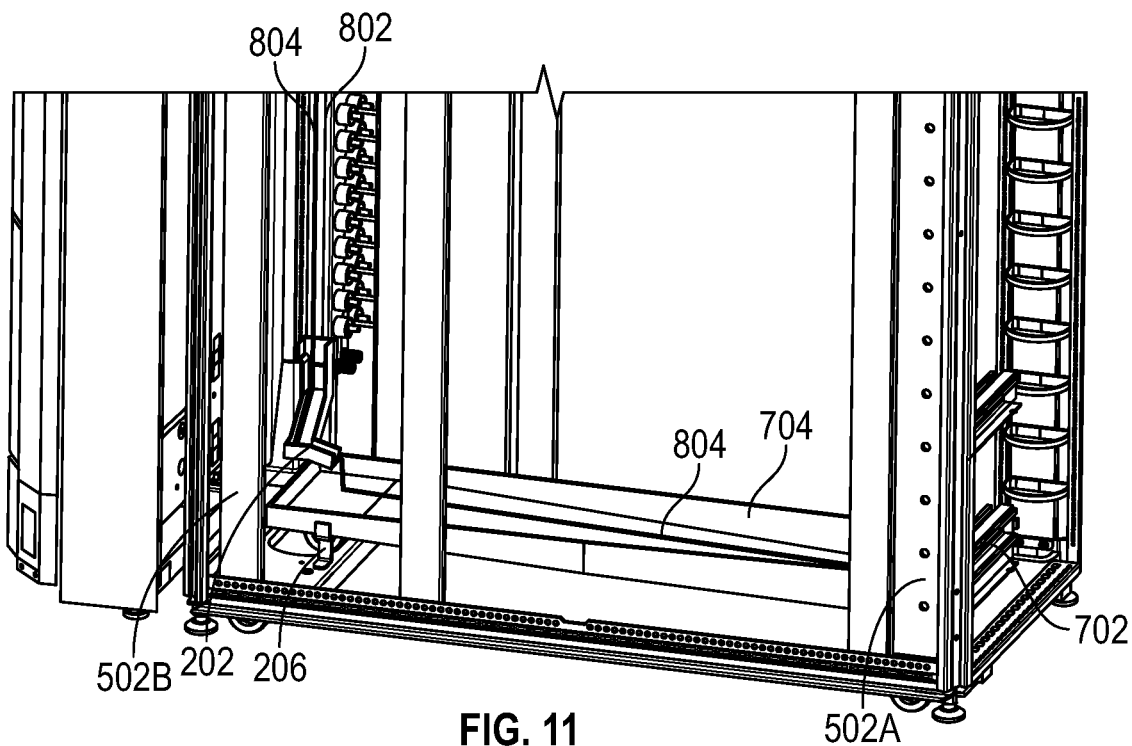
FIG. 11 illustrates a perspective view of the liquid collection system with air baffles installed in accordance with an embodiment of the disclosure.

FIG. 11 illustrates a perspective view of the liquid collection system with air baffles installed in accordance with an embodiment of the disclosure. As shown, the manifold spout 202 is connected to the manifold 802. The leak detection rope 804 extends along the liquid cooling manifold 802 down to the manifold spout 202 and falls into the collection tray 204 and extends toward the front end 218A of the collection tray 204 opposite to the back end 218B near the manifold tray 202. The liquid cooling manifold 802 is on the rear side 502B and the air baffles are the front side 502A.

Figure 12:
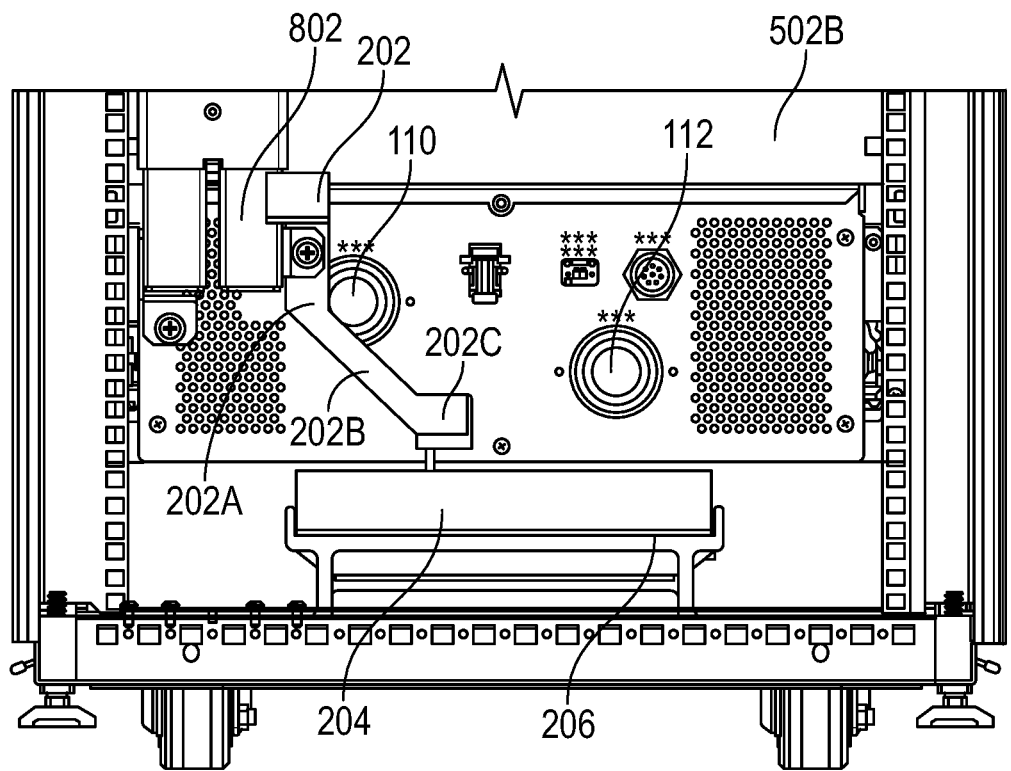
FIG. 12 illustrates s back view of the liquid collection system installed to collect liquids from an RPU and Quick Disconnects in accordance with an embodiment of the disclosure.

FIG. 12 illustrates s back view of the liquid collection system installed to collect liquids from an RPU and Quick Disconnects in accordance with an embodiment of the disclosure. As shown, the manifold spout 202 includes an upper section 202A coupled to the manifold 802, a middle section 202B angled to the upper section 202A, and a lower section 202C extending substantially parallel to the collection tray 204. The RPU 110 is positioned above the middle section 202B of the manifold spout 202. The QD 112 is also positioned above the collection tray 204 such that the liquids from both the RPU 110 and the QD 112 are collected by the collection tray 204.

The liquid collection and detection system 200 may be operated in the following procedures to collect leaked liquid, detect liquid, and contain liquids from servers on racks. First, the spout 202 is installed to couple to the liquid cooling manifold 802 and is used as a liquid channel. Second, the liquid can be collected in the tray 204 which serves as a reservoir for containing the liquid. Third, the liquid in the tray 204 can be detected by using the leak detection rope 804. Fourth, the level of the liquid in the tray 204 may be monitored through the cap 210 and/or the door 208. The cap 210 can be opened to allow the removal of the liquid in the tray. Alternatively, the door 208 can be slid by a user to open and to allow the removal of the liquid in the tray 204 without removing the tray from the rack 502.

Having described several embodiments, it will be recognized by those skilled in the art that various modifications, alternative constructions, and equivalents may be used without departing from the spirit of the invention. Additionally, a number of well-known processes and elements have not been described in order to avoid unnecessarily obscuring the invention. Accordingly, the above description should not be taken as limiting the scope of the invention.

Those skilled in the art will appreciate that the presently disclosed embodiments teach by way of example and not by limitation. Therefore, the matter contained in the above description or shown in the accompanying drawings should be interpreted as illustrative and not in a limiting sense. The following claims are intended to cover all generic and specific features described herein, as well as all statements of the scope of the method and system, which, as a matter of language, might be said to fall therebetween.

What is claimed is:

1. A system for collection, detection and containment of leaked liquid, the system comprising:
   a spout connected to a liquid cooling manifold for channeling liquid;
   a collection tray positioned under the spout and configured to contain the liquid from the spout; and
   a leak detection rope having a first end coupled to the liquid cooling manifold, a middle portion extending along the spout, and a second end placed inside the collection tray for detection of liquid.

2. The system of claim 1, wherein the collection tray has a bottom with a surrounding edge, four side walls extending upward from the surrounding edge of the bottom, and an open top configured to collect the liquid from the spout.

3. The system of claim 2, wherein the collection tray is configured to collect liquid dripped from any components comprising Reservoir Pump Unit (RPU) and Quick Connects positioned above the collection tray.

4. The system of claim 2, wherein at least one of the four side walls is positioned opposite to the liquid cooling manifold, and comprises a sliding door configured to be manually opened and closed by a user.

5. The system of claim 4, wherein the sliding door comprises an optically transparent or semi-transparent material to allow a liquid level in the collection tray to be visually monitored.

6. The system of claim 2, wherein at least one of the four side walls comprises a protruded opening, the protruded opening being able to be fluidly sealed by a cap.

7. The system of claim 6, wherein the cap comprises a transparent or semi-transparent material to allow a liquid level in the collection tray to be visually monitored.

8. The system of claim 2, wherein the bottom of the collection tray comprises a near-rectangular shape.

9. The system of claim 2, further comprising a bracket configured to attach to a rack for servers.

10. The system of claim 9, wherein the collection tray has a front end configured to have a bottom attachment configured to attach to the rack, wherein the collection tray has a back end configured to be supported by the bracket.

11. The system of claim 10, wherein the four side walls comprise a front side wall near the front end of the collection tray, and a back side wall, and two connection side walls connecting to the front side wall and the back side wall, wherein the front side wall has a smaller width and a larger depth than the back side wall near the back end of the collection tray.

12. The system of claim 11, wherein each of the two connection side walls between the front end and the back end comprises at least one section that has the depth continuously increasing.

13. The system of claim 11, wherein each of the two connection side walls between the front end and the back end comprises at least one section that has the width continuously decreasing.

14. The system of claim 1, wherein the spout comprises a first section fluidly coupled to a second section at a first angle.

15. The system of claim 14, wherein the spout further comprises a third section fluidly coupled to the second section of the spout at a second angle.

16. The system of claim 15, wherein the first section is configured to allow the liquid to flow down vertically, wherein the second section and the third section are configured to allow the liquid to flow into the collection tray.

17. The system of claim 1, wherein the leak detection rope is configured to detect liquid.

18. A collection tray for collecting liquid, the collection tray comprising:
   a bottom with a surrounding edge;
   four side walls extending upward from the surrounding edge of the bottom and surrounding an open top;
   a front end with a bottom attachment configured to attach to a rack;
   a back end configured to be supported by a bracket that is attached to the rack; and
   a leak detection rope having a first end couplable to a liquid cooling manifold, a middle portion arranged for placement along a spout, and a second end arranged inside the collection tray.

19. The collection tray of claim 18, wherein the four side walls comprise a front side wall near the front end of the collection tray, and a back side wall, and two connection side walls connecting to the front side wall and the back side wall, wherein the front side wall has a smaller width and a larger depth than the back side wall near the back end of the collection tray.

20. The collection tray of claim 19, wherein each of the two connection side walls between the front end and the back end comprises at least one section that has the depth continuously increasing and at least one section that has the width continuously decreasing.

* * * * *